United States Patent
Kim et al.

(10) Patent No.: US 7,294,854 B2
(45) Date of Patent: Nov. 13, 2007

(54) THIN FILM TRANSISTOR ARRAY PANEL AND LIQUID CRYSTAL DISPLAY INCLUDING THE PANEL

(75) Inventors: Sang-Soo Kim, Seoul (KR); Dong-Gyu Kim, Yongin (KR)

(73) Assignee: Samsung Electronics Co., Ltd. (KR)

( * ) Notice: Subject to any disclaimer, the term of this patent is extended or adjusted under 35 U.S.C. 154(b) by 80 days.

(21) Appl. No.: 10/525,039

(22) PCT Filed: Sep. 18, 2002

(86) PCT No.: PCT/KR02/01758

§ 371 (c)(1),
(2), (4) Date: Sep. 7, 2005

(87) PCT Pub. No.: WO2004/019122

PCT Pub. Date: Mar. 4, 2004

(65) Prior Publication Data

US 2006/0102903 A1   May 18, 2006

(30) Foreign Application Priority Data

Aug. 21, 2002   (KR) ............................ 2002-0049458

(51) Int. Cl.
*H01L 29/04* (2006.01)
*H01L 31/036* (2006.01)
*H01L 31/0376* (2006.01)
*H01L 31/20* (2006.01)

(52) U.S. Cl. .................... 257/59; 257/72; 257/E29.273

(58) Field of Classification Search .................. 257/59, 257/72, E29.273
See application file for complete search history.

(56) References Cited

U.S. PATENT DOCUMENTS 5,517,342 A * 5/1996 Kim et al. .................... 349/43
5,703,382 A   12/1997 Hack et al. .................... 257/72
5,745,200 A   4/1998 Kikuchi et al. ............... 349/99
6,445,003 B1 * 9/2002 Chang et al. .................. 257/59
2002/0053701 A1   5/2002 Kong et al.

FOREIGN PATENT DOCUMENTS

| JP | 08-320503 | 12/1996 |
| JP | 2004-194823 | 7/2004 |
| KR | 97-28763 | 6/1997 |
| KR | 98-78722 | 11/1997 |

\* cited by examiner

*Primary Examiner*—Phat X. Cao
(74) *Attorney, Agent, or Firm*—MacPherson Kwok Chen & Heid LLP

(57) ABSTRACT

A gate wire including a gate line extending in a transverse direction and a gate electrode connected to the gate line is form on an insulating substrate. A storage capacitor wire including a storage capacitor electrode line extending in the transverse direction and a storage electrode connected to the storage capacitor electrode line and located at the edges of a pixel area is formed. A semiconductor layer is formed on a gate insulating film covering the gate wire and the storage capacitor wire. A data wire is formed on the gate insulating film or the semiconductor layer and includes a data line intersecting the gate line to define the pixel area, a source electrode connected to the data line and located on the semiconductor layer, a drain electrode formed on the semiconductor layer and located opposite the source electrode with respect to the gate electrode, and a first storage capacitor conductor overlapping the storage capacitor electrode via the gate insulating film to form a storage capacitor. A pixel electrode electrically connected to the drain electrode and the first storage capacitor conductor is formed on the protective layer covering the data wire.

7 Claims, 4 Drawing Sheets

THIN FILM TRANSISTOR ARRAY PANEL AND LIQUID CRYSTAL DISPLAY INCLUDING THE PANEL

BACKGROUND OF THE INVENTION (a) Field of the Invention

The present invention relates to a thin film transistor array panel and a liquid crystal display having a thin film transistor array panel, and in particular, to a thin film transistor array panel including a storage electrode overlapping a pixel electrode to form a storage capacitor and a liquid crystal display having a thin film transistor array panel.

(b) Description of the Related Art

A liquid crystal display ("LCD") is one of the most widely used flat panel displays. An LCD includes two panels having field-generating electrodes, a liquid crystal layer interposed therebetween and two polarizing plates polarizing light and attached on outer surfaces of the panels, respectively. The LCD controls the transmittance of light passing through the liquid crystal layer by realigning liquid crystal molecules in the liquid crystal layer with voltages applied to the electrodes. The LCD uses one of the properties of the liquid crystal material that the alignment of the liquid crystal molecules is changed by applied voltages. However, the LCD using transmission and reflection properties of light needs a light source since the liquid crystal is not self-illuminant.

Generally, a thin film transistor ("TFT") array panel for a liquid crystal display ("LCD") is used as a circuit board for driving the respective pixels in an independent manner. The TFT array panel includes a scanning signal wire or a gate wire transmitting scanning signals, an image signal wire or a data wire transmitting image signals, TFTs connected to the gate and the data wire, and pixel electrodes connected to the wires through the TFTs for displaying images. The TFT array panel also includes storage electrodes overlapping the pixel electrodes to form storage capacitors having storage capacitance. The storage electrodes may be formed by modifying the shapes of the gate lines or formed separated from the gate lines.

The LCD, which displays images by transmitting light from a light source, has to ensure high aperture ratio.

The storage electrodes overlapping the pixel electrodes have to large areas for giving sufficient storage capacitance, but in this case, the aperture ratio is decreased.

SUMMARY OF THE INVENTION

It is an object of the present invention to provide a thin film transistor array panel and a liquid crystal display having high aperture ratio and ensuring sufficient storage capacitance.

These and other objects may be achieved by locating a storage electrode to overlap a black matrix and by locating a storage capacitor conductor connected to a pixel electrode between the storage electrode and a pixel electrode.

According to one aspect of the present invention, in a thin film transistor array panel, a gate wire including a gate line and a gate electrode connected to the gate line is form on an insulating substrate. A storage capacitor wire including a storage capacitor electrode line and a storage electrode connected to the storage capacitor electrode line and located at an edge of a pixel area is formed. A semiconductor layer is formed on a gate insulating film covering the gate wire and the storage capacitor wire. A data wire is formed on the gate insulating film or the semiconductor layer and includes a data line intersecting the gate line to form the pixel area, a source electrode connected to the data line and located on the semiconductor layer, a drain electrode formed on the semiconductor layer and located opposite the source electrode with respect to the gate electrode, and a first storage capacitor conductor overlapping the storage electrode via the gate insulating film to form a storage capacitor. A pixel electrode is formed to be electrically connected to the drain electrode and the first storage capacitor conductor.

It is preferable that the drain electrode is connected to the first storage capacitor conductor. Moreover, it is preferable that the TFT array panel further includes a protective layer formed on a second storage capacitor conductor or a protective layer located between the pixel electrode and the drain electrode and the first storage capacitor conductor.

The semiconductor layer except for a channel area between the source electrode and the drain electrode may have the same pattern as the data wire, and may have a pattern formed between the semiconductor layer and the data wire and having the same pattern as the data wire.

DETAILED DESCRIPTION OF PREFERRED EMBODIMENTS

Figure 1:
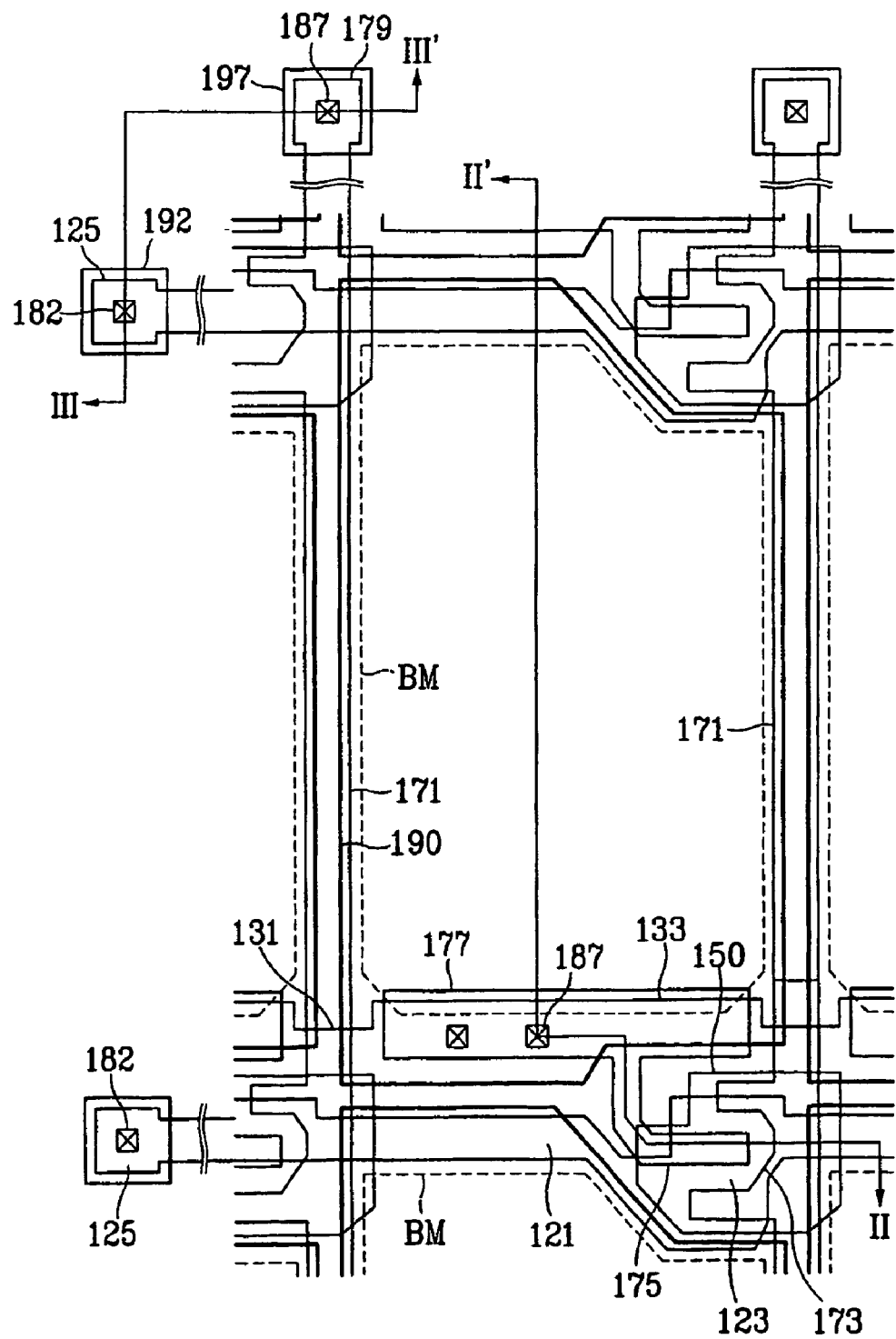
FIG. 1 is a layout view of a TFT array panel for an LCD according to a first embodiment of the present invention.

The present invention now will be described more fully hereinafter with reference to the accompanying drawings, in which preferred embodiments of the inventions invention are shown. The present invention may, however, be embodied in many different forms and should not be construed as limited to the embodiments set forth herein.

In the drawings, the thickness of layers and regions are exaggerated for clarity. Like numerals refer to like elements throughout. It will be understood that when an element such as a layer, region or substrate is referred to as being "on" another element, it can be directly on the other element or intervening elements may also be present. In contrast, when an element is referred to as being "directly on" another element, there are no intervening elements present.

Now, TFT array panels and LCDs including TFT array panels according to embodiments of the present invention is described in detail with reference to the drawings.

The LCD according to an embodiment of the present invention includes a plurality of gate lines and a plurality of data lines intersecting each other to define a plurality of pixel areas. A plurality of TFTs are provided at the intersections of the gate lines and the data lines. Each TFT includes a gate electrode connected to one of the gate lines, a source electrode connected to one of the data lines, and a drain electrode located opposite the source electrode with respect to the gate electrode. A plurality of pixel electrodes and a plurality of storage electrodes are formed in the pixel areas. The pixel electrodes are electrically connected to the data lines through the TFTs. The storage electrodes overlap the pixel electrodes to form storage capacitors. The storage electrodes are located at the edges of the pixel areas and overlap a black matrix at the borders. The black matrix has a plurality of apertures, light-transmitting areas provided on the pixel areas. A plurality of storage capacitor conductors are formed at the edges of the pixel areas. The storage capacitor conductors are located between the storage electrodes and the pixel electrodes and electrically connected to the pixel electrodes for ensuring sufficient storage capacitance in narrow areas.

A structure of a TFT array panel for an LCD according to an embodiment of the present invention is described in detail.

First, a structure of a TFT array panel for an LCD according to a first embodiment of the present invention is described in detail with reference to FIGS. 1 to 3.

Figure 2:
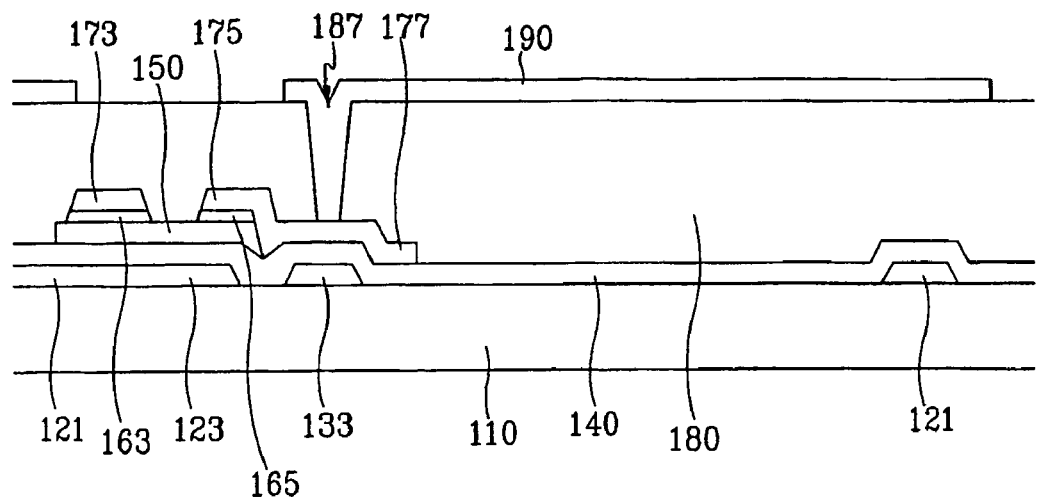
FIGS. 2 and 3 are sectional views of the TFT array panel shown in FIG. 1 taken along the lines II-II and III-III'.
Figure 3:
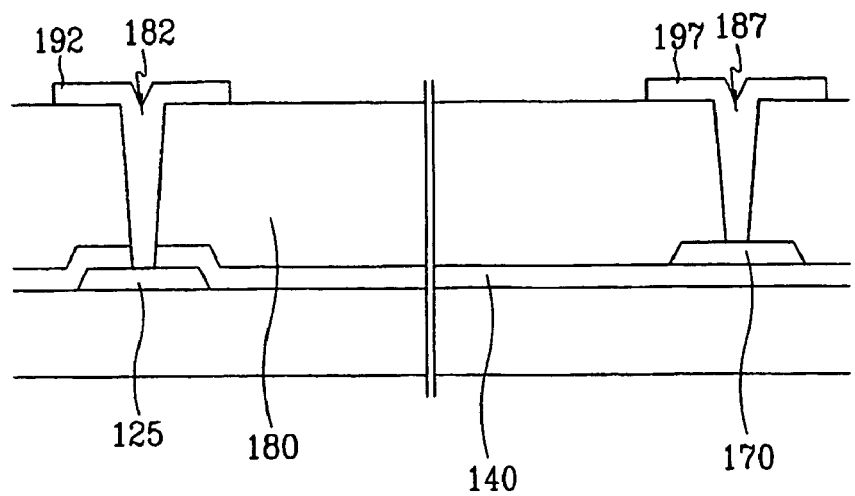

FIG. 1 is a layout view of a TFT array panel for an LCD according to a first embodiment of the present invention, and FIGS. 2 and 3 are sectional views of the TFT array panel shown in FIG. 1 taken along the lines II-II and III-III'. The portions surrounded by a dotted line are apertures of a black matrix BM for transmitting light.

A gate wire and a storage capacitor wire are formed on an insulating substrate 110. The gate wire and the storage capacitor wire include a single layer having low resistivity such as Ag, Ag alloy, Al or Al alloy, or multiple layers including the single layer.

The gate wire includes a plurality of gate lines 121 extending in a transverse direction, a plurality of gate pads 125 connected to one ends of the gate lines 121 to transmit gate signals from an external device to the gate lines 121, and a plurality of gate electrodes 123 of TFTs connected to the gate lines 121. The storage capacitor wire includes a plurality of storage capacitor electrode lines 131 and a plurality of storage electrodes 133. The storage capacitor electrode lines 131 extend in a transverse direction receive gate signals and a common signal applied to a common electrode provided on a common panel facing the TFT array panel. The storage electrodes 133 are connected to the storage capacitor electrode lines 131 and overlap the black matrix BM at the edges of the pixel areas for enhancing the aperture ratio of the pixels. The storage electrodes 133 overlap storage capacitor conductors 177 connected to pixel electrodes 190, which will be described later, to form storage capacitors. When the gate wire 121, 125 and 123 and the storage capacitor wire 131 and 133 include multiple layers, one of the multiple layers may include conductive material with low resistivity and other may include conductive material for a pad good contact property with other materials.

A gate insulating layer 140 preferably made of SiNx on the substrate 110 covers the gate wire 121, 125 and 123.

A semiconductor layer 150 preferably made of amorphous silicon or polysilicon is formed on the gate insulating layer 140 opposite the gate electrodes 125. An ohmic contact layer 163 and 165 preferably made of silicide or n+ hydrogenated amorphous silicon heavily doped with n type impurities is formed on the semiconductor layer 150.

A data wire is formed on the ohmic contact layer 163 and 165 and the gate insulating layer 140. The data wire includes a single layer having low resistivity such as Ag, Ag alloy, Al or Al alloy or multiple layers including the single layer. The data wire includes a plurality of data lines 171 extending in a longitudinal direction and intersecting the gate lines 121 to define a plurality of pixels, a plurality of source electrodes 173 branched from the data lines 171 and extending onto a portion 163 of the ohmic contact layer, a plurality of data pads 179 connected to one ends of the data lines 171 to receive image signals from an external device, and a plurality of drain electrodes 175 formed on the other portion 165 of the ohmic contact layer 165, located opposite the source electrodes 173 with respect to the gate electrodes 123, and separated from the source electrodes 173. The data wire also includes a plurality of storage capacitor conductors 177 electrically connected to pixel electrodes 190 described later and overlapping the storage electrodes 133 at the edges of the pixel areas to form storage capacitance for ensuring sufficient storage capacitance and to have high aperture ratio of the pixels. The storage capacitor conductors 177 overlap the black matrix BM at the edges of the pixel areas for ensuring sufficiently large aperture ratio of the pixels, and also overlap the storage electrodes 133 only via the gate insulating layer 140 for ensuring optimum storage capacitance with narrow overlapping areas. In this embodiment, the storage capacitor conductors 177 are connected to the drain electrodes 175, but may be separated from the drain electrodes 175.

A protective layer 180 is formed on the data wire 171, 173, 175, 177 and 179 and portions of the semiconductor pattern 150 which are not covered with the data wire 171, 173, 175, 177 and 179. The protective layer 180 preferably includes an inorganic material such as SiOx and SiNx, an organic material, or a low dielectric insulating material such as Si:O:C and Si:O:F deposited by chemical vapor deposition ("CVD"). The protective layer 180 may have a single-layered structure or multiple-layered structure. Preferably, the semiconductor layer 150 is in contact with an insulating layer of SiNx, and there is no organic material in pad areas provided with the pads.

The protective layer 180 is provided with a plurality of contact holes 187 and 189 respectively exposing the storage capacitor conductors 177 and the data pads 179, and the protective layer 180 and the gate insulating layer 140 has a plurality of contact holes 182 exposing the gate pads 125.

A plurality of pixel electrodes 190 are formed on the protective layer 180. The pixel electrodes 190 are located in the pixel areas and electrically connected to the storage capacitor conductors 177 and the drain electrode 175 through the contact holes 187. Furthermore, a plurality of subsidiary gate pads 92 and a plurality of subsidiary data pads 97 are formed on the protective layer 180. The subsidiary gate pads 92 and the subsidiary data pads 97 are connected to the gate pads 125 and the data pads 179 through the contact holes 182 and 189, respectively. The pixel electrodes 190, the subsidiary gate pads 92 and the subsidiary data pads 97 are preferably formed of transparent conductive material such as indium tin oxide ("ITO") or indium zinc oxide ("IZO"). However, the pixel electrodes 190 for a reflective type LCD are made of a reflective conductive material such as Ag, Ag alloy, Al, or Al alloy.

In the structure of a TFT array panel for an LCD according to the embodiment of present invention, the storage capacitor wire 131 and 133 overlaps the black matrix BM at the edges of the pixel areas for ensuring aperture ratio of the pixels. In addition, the storage capacitor wire 131 and 133 overlaps the storage capacitor conductors 177 connected to the pixel electrodes 190 only via the gate insulating layer 140 to form storage capacitors for obtaining sufficient storage capacitance.

Meanwhile, in order to minimize the manufacturing cost, a semiconductor layer and a data wire are manufactured by a photo etching process using one photoresist pattern. Therefore, a TFT array panel for an LCD such a semiconductor layer and a data wire provides substantially the same planar shapes of the semiconductor layer and the data wire.

Next, such a structure of a TFT array panel for an LCD is described in detail with reference to the drawings.

Figure 4:
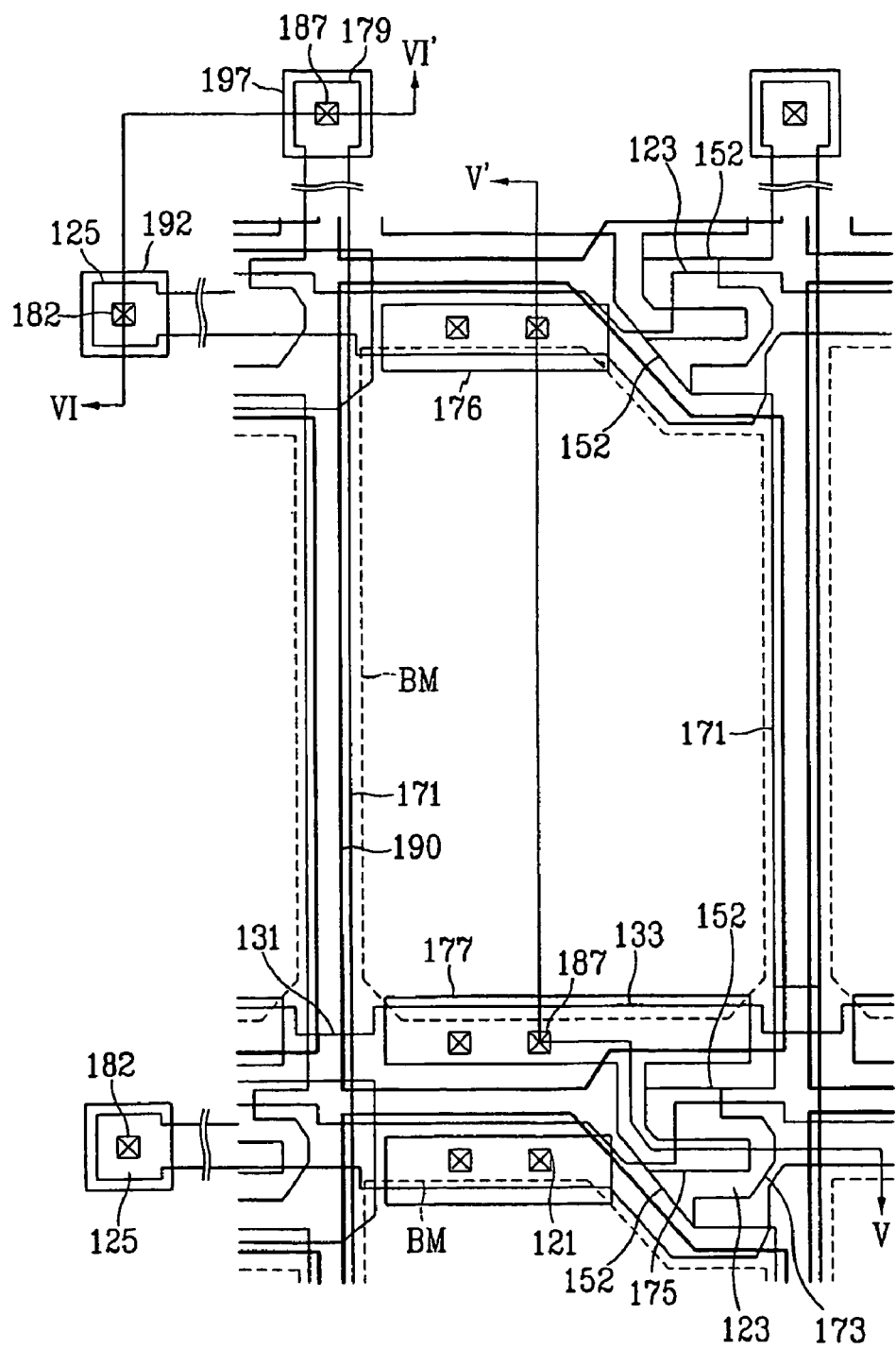
FIG. 4 is a layout view of a TFT array panel for an LCD according to a second embodiment of the present invention.
Figure 5:
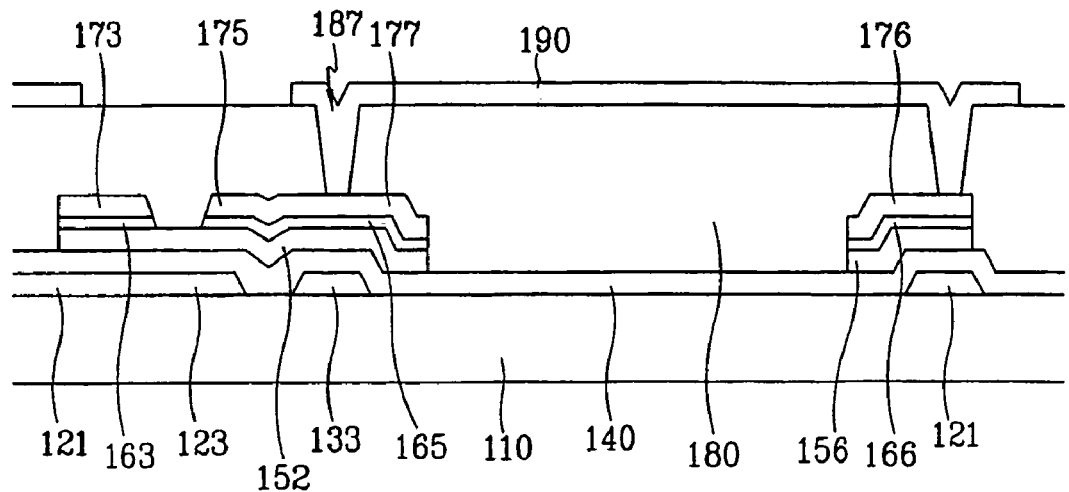
FIGS. 5 and 6 are sectional views of the TFT array panel shown in FIG. 4 taken along the lines V-V and VI-VI'.
Figure 6:
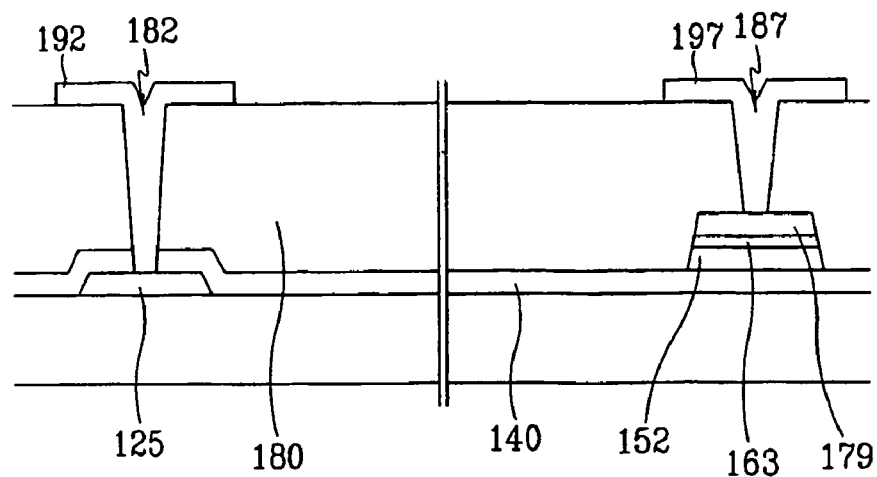

First, a structure of a pixel unit on a TFT array panel for an LCD manufactured using four masks according to a second embodiment of the present invention with reference to FIGS. 4 to 6.

FIG. 4 is a layout view of a TFT array panel for an LCD according to a second embodiment of the present invention, and FIGS. 5 and 6 are sectional views of the TFT array panel shown FIG. 4 taken along the lines V-V' and VI-VI', respectively.

A gate wire 121, 125 and 123 including a conductive layer made of a low resistivity conductive material is formed on an insulating substrate 110. The gate wire includes a plurality of gate lines 121, a plurality of gate pads 125, and a plurality of gate electrodes 123.

A storage capacitor wire including a plurality of storage capacitor electrode lines 131 parallel to the gate lines 121 and a plurality of storage electrodes 133 connected to the storage capacitor electrode lines 131 are formed on the substrate 110. The storage capacitor electrode lines 131 are applied with a voltage such as a common voltage to be applied to a common electrode of an upper panel or gate voltages from an external device. The storage capacitor electrode 133 overlap first storage capacitor conductors 177 connected to pixel electrodes 190 to form storage capacitors for enhancing the charge storing capacity of the pixels, which is described later. In case that the overlapping of second storage capacitor conductors 176 connected to the pixel electrodes 190 described later and the previous gate lines 121 transmitting neighboring pixel rows ensure sufficient storage capacitance, the storage capacitor wire 131 and 133 may be omitted.

In this structure, since the storage capacitance is formed by the overlapping of the previous gate lines 121 and the second storage capacitor conductors 176, which are described later, it is preferable that the gate signals transmitted to the previous gate lines 121 are transmitted to the storage capacitor wire 131 and 133.

A gate insulating layer 140 preferably made of SiNx is formed on the gate wire 121, 125 and 123 and the storage capacitor wire 131 and 133 to cover the gate wire 121, 125 and 123 and the storage capacitor wire 131 and 133.

A semiconductor pattern 152 and 156 preferably made of polysilicon are formed on the gate insulating layer 140. An ohmic contact pattern or an intermediate layer pattern 163, 165 and 166 preferably made of amorphous silicon heavily doped with n type impurities such as phosphorous P or p type impurities are formed on the semiconductor pattern 152 and 156.

A data wire is formed on the ohmic contact pattern 163 and 165. The data wire 171, 173, 175 and 179 includes a conductive film made of a material with low resistivity like the first embodiment. The data wire includes a plurality of data line units 171, 173 and 179 and a plurality of drain electrodes 175 of TFTs. Each data line unit 171, 173 and 179 includes a data line 171 extending in the longitudinal direction, a data pad 179 connected to one end of the data line 171 to receive image signals from an external device, and a plurality of source electrodes 173 of TFTs branched from the data line 171. Each drain electrode 175 is separated from the data line units 171, 179 and 173 and placed opposite to the corresponding source electrode 173 with respect to the corresponding gate electrode 123 or the channel area C of the TFT. Moreover, the data wire further includes a plurality of first storage capacitor conductors 177 located on the storage electrodes 133 and a plurality of second storage capacitor conductors 177 located on the ohmic contact pattern 166 opposite the previous gate lines 121 and overlapping the pixel electrodes 190, which are described later. In the absence of the storage capacitor wire 131 and 133, the first storage capacitor conductors 177 are also omitted.

The data wire 171, 173, 175, 176, 177 and 179 preferably includes a conductive film made of Al or Al alloy, Cr, Mo or Mo alloy, Ta or Ti.

The ohmic contact pattern 163, 165 and 166 reduces the contact resistance between the underlying semiconductor pattern 152 and 156 and the overlying data wire 171, 173, 175, 176, 177 and 179 and has substantially the same shape as the data wire 171, 173, 175, 176, 177 and 179. That is, the ohmic contact pattern 163, 165 and 166 includes a plurality of data-line ohmic contacts 163 having substantially the same shapes as the data line units 171, 179 and 173, a plurality of drain-electrode ohmic contacts 163 having substantially the same shapes as the drain electrodes 173 and the first storage capacitor conductors 177, and a plurality of storage-capacitor ohmic contacts 166 having substantially the same shapes as the second storage capacitor conductors 176.

Meanwhile, the semiconductor pattern 152 and 156 has substantially the same shape as the data wire 171, 173, 175, 176, 177 and 179 and the ohmic contact pattern 163, 165 and 166 except for the TFT channel areas C. Specifically, the semiconductor pattern includes a plurality of storage-capacitor semiconductors 156 having substantially the same shapes as the storage-capacitor ohmic contact pattern 156 and the second storage capacitor conductors 177 and a plurality of TFT semiconductors 152 which have little different shapes from the remains of the data wire and the ohmic contact pattern. That is, the source and the drain electrodes 173 and 175 are separated from each other at the TFT channel areas C, where the data-line ohmic contacts 163 and the drain-electrode ohmic contacts 165 are also separated from each other. However, the TFT semiconductors 152 continue to proceed there without disconnection to form TFT channels.

A protective layer 180 is formed on the data wire 171, 173, 175, 176, 177 and 179 and portions of the semiconductor pattern 152 which are not covered with the data wire 171, 173, 175, 176, 177 and 179. The protective layer 180 preferably includes SiOx and SiNx, an organic material a low dielectric insulating material or a low dielectric CVD material including Si:O:C and Si:O:F deposited by CVD.

The protective layer 180 has a plurality of contact holes 187, 189 and 186 exposing the first storage capacitor conductors 177, the data pads 179 and the second storage capacitor conductors 176. The protective layer 180 together with the gate insulating layer 140 is further provided with a plurality of contact holes 182 exposing the gate pads 125.

A plurality of pixel electrodes 190 receiving image signals from the TFTs and generating electric fields in cooperation with an electrode of an upper panel are formed on the protective layer 180. The pixel electrodes 190 are formed of a transparent conductive material such as ITO and IZO, and physically and electrically connected to the drain electrodes 175 and the first storage capacitor conductors 177 through the contact holes 187 to receive the image signals. The pixel electrodes 190 overlap the neighboring gate lines 121 and the adjacent data lines 171 to enlarge the aperture ratio, but the overlapping may be omitted. The pixel electrodes 190 are also connected to the second storage capacitor conductors 176 through the contact holes 186 to transmit the image signals to the second storage capacitor conductors 176.

Meanwhile, a plurality of subsidiary gate pads 95 and a plurality of subsidiary data pads 97 are formed on the gate pads 125 and the data pads 179 to be connected thereto through the contact holes 182 and 189, respectively. The subsidiary gate pads 95 and the subsidiary data pads 97 compensate the adhesiveness of the pads 125 and 179 to external circuit devices and protect the pads 125 and 179. The subsidiary gate pads 95 and the subsidiary data pads 97 are not requisites but may be introduced in a selective manner.

While the present invention has been described in detail with reference to the preferred embodiments, those skilled in the art will appreciate that various modifications and substitutions can be made thereto without departing from the spirit and scope of the present invention as set forth in the appended claims.

Accordingly, the storage capacitor wire is disposed at the edges of the pixel areas and overlaps the storage capacitor conductors connected to the pixel electrodes to secure sufficient storage capacitance and to enlarge aperture ratio.

What is claimed is:

1. A thin film transistor array panel, comprising:
   an insulating substrate;
   a gate wire formed on the insulating substrate and including a gate line and a gate electrode connected to the gate line;
   a storage capacitor wire formed on the insulating substrate and having a storage capacitor electrode line and a storage electrode connected to the storage capacitor electrode line and located at an edge of a pixel area;
   a gate insulating film covering the gate wire and the storage capacitor wire;
   a semiconductor layer formed on the gate insulating film;
   a data wire formed on the gate insulating film or the semiconductor layer and including a data line intersecting the gate line to define the pixel area, a source electrode connected to the data line and located on the semiconductor layer, a drain electrode formed on the semiconductor layer and located opposite the source electrode with respect to the gate electrode, and a first storage capacitor conductor overlapping the storage electrode via the gate insulating film to form a storage capacitor;
   a pixel electrode electrically connected to the drain electrode and the first storage capacitor conductor; and,
   a protective layer formed between the pixel electrode and the drain electrode and the first storage capacitor conductor.

2. The thin film transistor array panel of claim 1, wherein the drain electrode is connected to the first storage capacitor conductor.

3. The thin film transistor array panel of claim 1, further comprising a second storage capacitor conductor overlapping a previous gate line to form a storage capacitor at an edge of the pixel area.

4. The thin film transistor array panel of claim 1, wherein the semiconductor layer except for a channel area between the source electrode and the drain electrode has substantially the same pattern as the data wire.

5. The thin film transistor array panel of claim 1, further comprising an ohmic contact pattern formed between the semiconductor layer and the data line and has the same pattern as the data line.

6. A liquid crystal display comprising the thin film transistor array panel of claim 1.

7. The liquid crystal display of claim 6, further comprising a black matrix having an aperture in the pixel area, at least one portion of the black matrix overlapping the first storage capacitor conductor.

* * * * *